Figure 1:
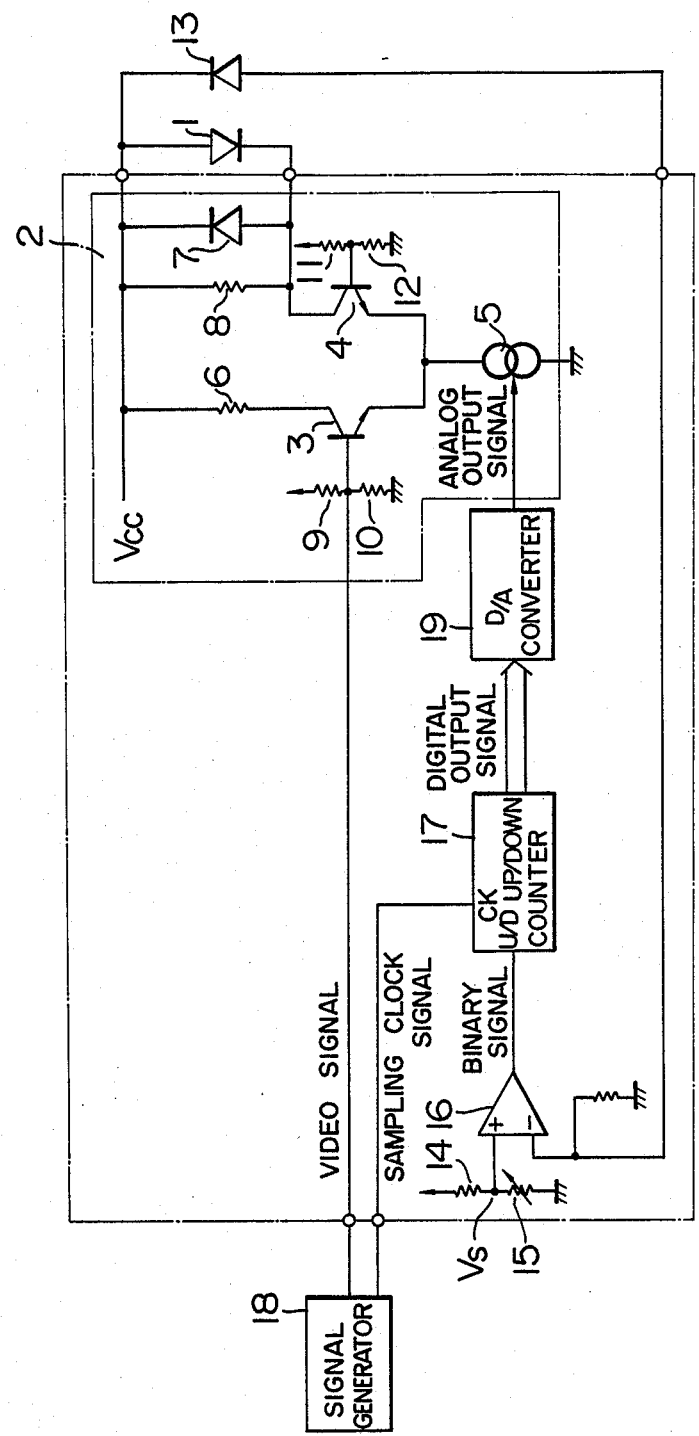

United States Patent [19]

Hongo et al.

[11] Patent Number: 4,580,044

[45] Date of Patent: Apr. 1, 1986

[54] LASER APPARATUS WITH CONTROL CIRCUIT FOR STABILIZING LASER OUTPUT

[75] Inventors: Jinichi Hongo, Hitachi; Shoichi Ito, Ibaraki, both of Japan

[73] Assignee: Hitachi, Ltd., Tokyo, Japan

[21] Appl. No.: 499,869

[22] Filed: Jun. 1, 1983

[30] Foreign Application Priority Data

Jun. 3, 1982 [JP] Japan .................................. 57-93973

[51] Int. Cl.$^4$ ............................................... G01J 1/32
[52] U.S. Cl. ......................................... 250/205; 372/31
[58] Field of Search ........................ 250/205, 214 AG;
307/311; 355/67; 346/76 L; 372/29-32

[56] References Cited

U.S. PATENT DOCUMENTS

| | | | |
|---|---|---|---|
| 4,097,731 | 6/1978 | Krause et al. | 250/205 |
| 4,097,732 | 6/1978 | Krause et al. | 250/205 |
| 4,133,008 | 1/1979 | Tisue | 250/214 AG |
| 4,158,132 | 6/1979 | O'Dell | 250/205 |
| 4,406,996 | 9/1983 | Oka | 250/205 |

Primary Examiner—Edward P. Westin
Attorney, Agent, or Firm—Antonelli, Terry & Wands

[57] ABSTRACT

A laser light source device in which the intensity of laser light emitted from a laser diode is detected, the detected value of the light intensity is compared with a predetermined value to generate a binary signal, the binary signal is used to control the count mode of an up/down counter, and a current for driving the laser diode is controlled on the basis of the output of the up/down counter, to prevent the intensity of laser light from decreasing.

8 Claims, 2 Drawing Figures

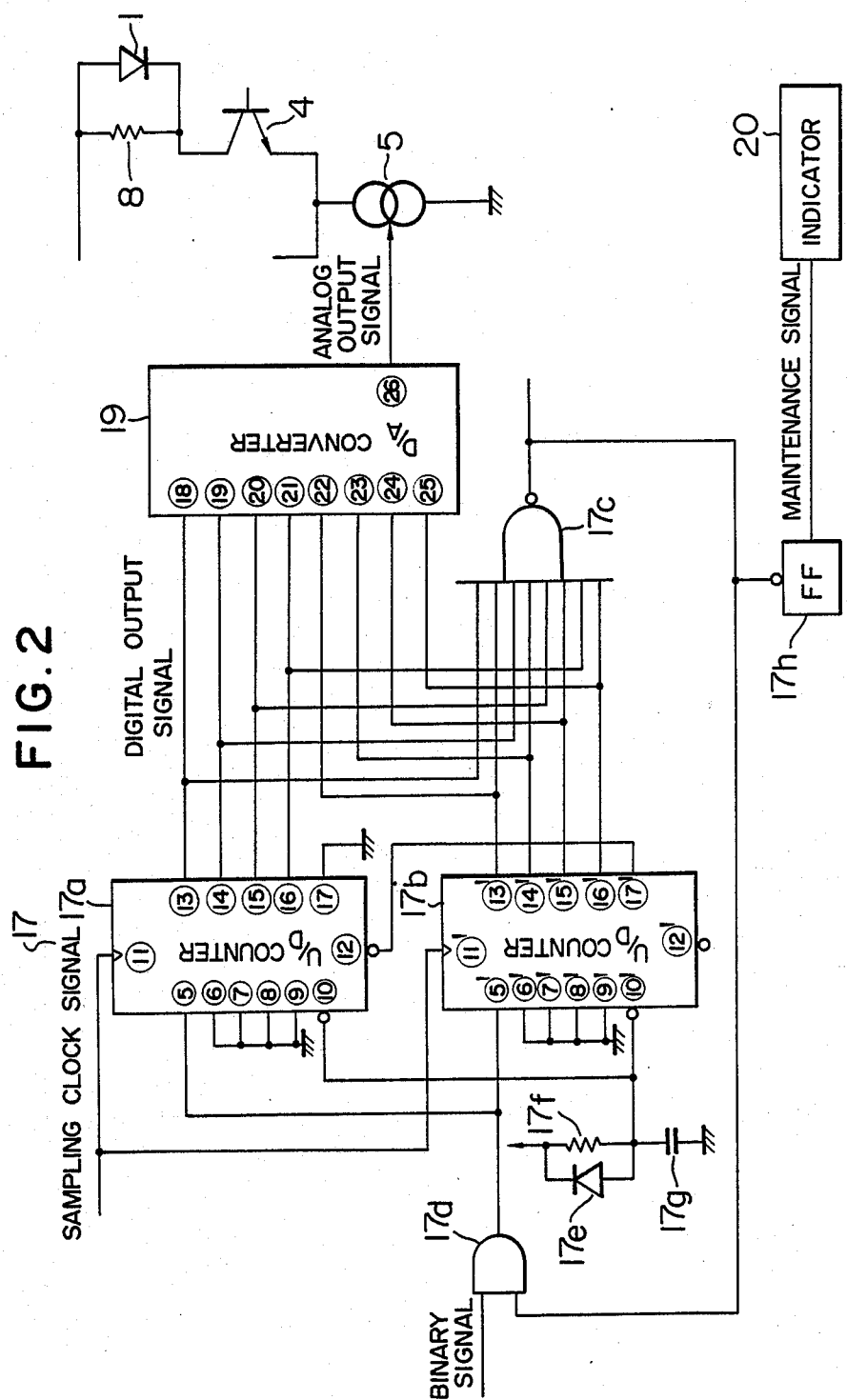

LASER APPARATUS WITH CONTROL CIRCUIT FOR STABILIZING LASER OUTPUT

The present invention relates to a laser light source device, and more particularly to a laser light source device suitable for use in a laser beam printer and others.

In many of laser beam printers which include a laser diode to utilize the electrophotographic method, a photoconductive surface of a drum is scanned by and exposed to laser light emitted from the laser diode to form an electrostatic latent image in the photoconductive surface, and then a toner image obtained by developing the latent image of electric charge is transferred to ordinary recording paper to fix the transferred toner image, thereby recording a desired image on the recording paper. In the case where the laser diode is used as a light source, laser light is modulated by a video signal for forming a picture image, in such a manner that a laser-diode driving current is fed or cut in accordance with the video signal, that is, the laser light is intermittently generated. The scanning exposure of the photoconductive surface of the drum is carried out in the following manner. The photoconductive surface of the drum is repeatedly scanned with a laser light spot in a direction parallel to the rotating axis of the drum by deflecting the laser light by means of a rotating mirror or vibrating mirror, while rotating the drum at a constant speed. In order to synchronize the scanning exposure with the modulation of the laser light, the laser light is deflected to the outside of a picture image area on the photoconductive surface of the drum, and the deflected light impinges upon a photoelectric conversion element which is disposed on the outside of the above-mentioned area for the purpose of position detection. Thus, a deflecting position can be detected. The photoelectric transducer for position detection is generally disposed on the side of the starting point of a scanning line, and the laser light is modulated in accordance with the time elapsed after the laser light spot has left the photoelectric transducer. Further, in order to cause the laser light emitted from the laser diode to form the laser light spot having a predetermined shape on the photoconductive surface of the drum, to prevent the laser light spot from deviating from the scanning position, or to prevent a deflecting angle of the laser light formed by a deflecting mirror from being too large, various lenses and mirrors are arranged on a laser light path.

In such laser beam printers, the intensity of laser light incident upon the photoconductive surface of the drum is required to be kept a predetermined constant level, in order to obtain a picture image of high quality. Since the luminous intensity of a laser diode varies with temperature, it has been proposed to provide in the laser beam printers thermostatic means for maintaining the laser diode at a constant temperature. However, the luminous efficiency of the laser diode also decreases due to the fatigue or degradation thereof. Further, in the laser beam printers, laser light incident upon the photoconductive surface of the drum is attenuated by stains on the lenses and mirrors, and therefore the intensity of the laser light incident upon the photoconductive surface varies even when the laser diode is kept at a constant temperature.

It is accordingly an object of the present invention to provide a laser light source device in which the intensity of laser light on a predetermined light path is kept constant.

In order to attain the above object, a laser light source device according to the present invention comprises a photoelectric transducer for converting the intensity of laser light emitted from a laser diode into an analog detection signal, a comparator for comparing the analog detection signal with a reference electrical signal to deliver a binary signal such as a high or low level signal, an up/down counter applied with the binary signal to change over from one of an up-count mode and a down-count mode to the other, a digital-to-analog converter for converting a digital output signal from the up/down counter into an analog output signal, and a current control circuit for controlling a current flowing through the laser diode in accordance with the analog output signal, whereby the intensity of laser light emitted from the laser diode is controlled so that the intensity of laser light at a predetermined position on a laser light path is kept constant.

The present invention will be apparent from the following detailed description taken in conjunction with the accompanying drawings, in which:

FIG. 1 is a block diagram showing the whole construction of an embodiment of a laser light source device according to the present invention; and FIG. 2 is a block diagram showing in detail a portion of the embodiment shown in FIG. 1.

The intensity of laser light emitted from a laser diode varies with a current flowing through the laser diode. According to a feedback control method used in a general constant-output control technique, an output from output means is detected to be compared with a reference value, and an input to the output means is corrected on the basis of a difference between the output and reference value. In the previously-mentioned laser beam printers, however, laser light is intermittently generated due to intensity modulation and deflected so as to scan a predetermined area. Accordingly, it is required to detect the intensity of the laser light in a short time by a photoelectric detector, and to hold the detected value till the next detecting time. That is, it is necessary to provide, in the laser beam printers, an analog memory circuit for sampling/holding an analog detection signal delivered from a photoelectric transducer for light-intensity detection and a digital memory circuit for storing therein a digital signal obtained by subjecting the analog detection signal to analog-to-digital conversion. In this case, a time in which the intensity of laser light is detected, is very short. Accordingly, the analog memory circuit and digital memory circuit are required to be rapid in response, and therefore they are expensive. Further, in the case where the analog detection signal indicating a photoelectric conversion value of laser light is not obtained, or in the case where a time the analog detection signal is generated, is not synchronized with a time the analog detection signal is sampled, a value to be stored in each of the memories comes to zero, and therefore the difference between the detected value and a reference value becomes large. When the current flowing through the laser diode is corrected on the basis of such a large difference, an excessive current flows through the laser diode, and thus the life thereof is shortened. On the other hand, according to the feedback control used in the present invention, it is judged by a comparator only whether the analog detection signal indicating a photoelectric conversion value of laser light is greater than a reference value or not, that is, the difference value between the analog detection signal and reference value is not taken into consideration, and a digital up/down counter counts a clock signal which is applied to the counter when a binary signal such as a high or low level signal is delivered from the comparator. Accordingly, the present invention can employ circuit elements which are inexpensive and rapid in response. Further, even when the difference between the analog detection signal and reference value is large, a large correction current does not flow through the laser diode, and therefore the life thereof is not shortened. In other words, an abrupt, great change is not caused in the luminous intensity of the laser diode when the laser diode is ordinarily used, and therefore the number of clock pulses which are supplied to the up/down counter when the binary signal is delivered from the comparator, can be made small (for example, made equal to one).

Now, a preferred embodiment of a laser light source device according to the present invention will be explained below, with reference to the drawings.

FIG. 1 shows a control circuit included in an embodiment of a laser light source device according to the present invention. Referring to FIG. 1, a current flowing through a laser diode 1 is controlled by a current control circuit 2. The circuit 2 includes transistors 3 and 4 making up a differential switch, and a constant current source 5. The emitters of the transistors 3 and 4 are connected to the constant current source 5 in common. The collector of the transistor 3 is connected to a power line through a resistor 6, and the collector of the transistor 4 is connected to the power line through a parallel combination of the laser diode 1, a reverse-voltage protecting diode 7 and a resistor 8. Resistors 9 and 10 are used for applying a bias voltage to the transistor 3, and resistors 11 and 12 are used for applying a bias voltage to the transistor 4. A photodiode 13 for photoelectric conversion is placed at a scanning position of deflected laser light, and delivers an analog detection signal corresponding to the intensity of laser light emitted from the laser diode 1. It is judged by a comparator 16 whether the analog detection signal delivered from the photodiode 13 is greater than a reference electrical signal determined by voltage-dividing resistors 14 and 15 or not. A binary signal delivered from the comparator 16 takes a high level when the analog detection signal is smaller than the reference electrical signal, and takes a low level when the analog detection signal is greater than the reference electrical signal. A digital up/down counter (hereinafter referred to as a "U/D counter") 17 takes an up-count mode or a down-count mode according as the binary signal applied to a count-mode control terminal U/D takes the high or low level, to count a sampling clock signal which is supplied from a signal generator 18 to a clock terminal CK. A digital output signal delivered from the U/D counter 17 is converted into an analog output signal by a digital-to-analog converter (hereinafter referred to as a "D/A converter") 19. The constant current source 5 is controlled by the analog output signal, and thus a constant current is set in accordance with the analog output signal. A video signal delivered from the signal generator 18 is applied to the base of the transistor 3.

FIG. 2 is a block diagram showing in detail a circuit portion including the U/D counter 17 and D/A converter 19. The U/D counter 17 includes 4-bit U/D counters 17a and 17b to form an 8-bit U/D counter. An 8-bit digital output signal from the U/D counter 17 is applied to input terminals of each of the 8-bit D/A converter 19 and an 8-input NAND gate 17c. Count-mode control terminals (hereinafter referred to as "U/D terminals") 5 and 5' of the U/D counters 17a and 17b are connected to the output terminal of a 2-input AND gate 17d. Data input terminals 6 to 9 and 6' to 9' of the counters 17a and 17b are grounded to take a low level. Load input terminals 10 and 10' of the counters 17a and 17b are connected to an initializing circuit made up of a diode 17e, a resistor 17f and a capacitor 17g, to be applied with a load pulse when a power switch (not shown) is turned on. Clock terminals (namely, CK terminals) and 11 and 11' are connected to a sampling -clock generating circuit. The 2-input AND gate 17d is applied with the binary signal delivered from the comparator 16 and the output signal of the 8-input NAND gate 17c. The output signal of the 8-input NAND gate 17c also triggers a flip-flop circuit 17h to generate a maintenance signal, which operates an indicator 20. The analog output signal from the D/A converter 19 is applied to the constant current source 5.

Now, explanation will be made on the circuit operation in the above-mentioned circuit configuration. When the power switch is turned on, a load pulse is supplied from the initializing circuit to the load input terminals 10 and 10' of the U/D counters 17a and 17b, and a minimum value "0" set at the data input terminals 6 to 9 and 6' to 9' is loaded in the U/D counters 17a and 17b. Accordingly, the digital output signal from the U/D counters 17a and 17b is equal to zero, and therefore the analog output signal from the D/A converter 19 is zero. That is, the set current in the constant current source 5 takes a minimum value. Thus, when the power switch is turned on, a current flowing through the laser diode 1 takes a minimum value, and therefore the analog detection signal from the photodiode 13 is small in amplitude. That is, the analog detection signal is smaller than the reference electrical signal which is to be compared with the analog detection signal by the comparator 16. Accordingly, the binary signal delivered from the comparator 16 takes a high level. Further, the output signal of the 8-input NAND gate 17c takes a high level. Therefore, the output signal of the 2-input AND gate 17d takes a high level. Thus, the U/D counters 17a and 17b take the up-count mode, and therefore count up by one least significant bit (namely, one LSB) of the input applied to the D/A converter 19, each time the sampling clock signal is applied to the counters 17a and 17b. Thus, until the analog detection signal delivered from the photodiode 13 becomes greater than the reference electrical signal, the U/D counters 17a and 17b count up to make large the digital output signal, and therefore the analog output signal from the D/A converter 19 becomes large, thereby increasing the set current in the constant current source 5. When the intensity of laser light emitted from the laser diode 1 increases to the extent that the analog detection signal delivered from the photodiode 13 becomes greater than the reference electrical signal, the binary signal delivered from the comparator 16 takes a low level. Thus, the U/D counters 17a and 17b take the down-count mode, and therefore count down by one LSB of the input applied to the D/A converter 19, each time the sampling clock signal is applied to the counters 17a and 17b. That is, the digital output signal from the counters 17a and 17b becomes small, and therefore the analog output signal from the D/A converter 19 also becomes small. Thus, the set current in the constant current source 5 is reduced. As a result of the reduction in the set current, the analog detection signal delivered from the photodiode 13 is made smaller than the reference electrical signal. Then, the binary signal from the comparator 16 takes the high level, and thus the U/D counters 17a and 17b take the up-count mode to increase the set current in the constant current source 5. Owing to such a current control operation, a current for driving the laser diode 1 is controlled so that the intensity of laser light emitted from the laser diode 1 lies in a range corresponding to a variation of ±1 LSB about a predetermined value.

In the case where the intensity of laser light incident upon the photodiode 13 is decreased due to the fatigue or degradation of the laser diode 1 or a stain in an optical system, the current control operation is performed in the state that the contents of the U/D counters 17a and 17b have been increased by the above-mentioned one LSB. The operating point of the U/D counters 17a and 17b becomes higher as the fatigue or degradation of the laser diode 1 proceeds or the stain in the optical system becomes large. Finally, the digital output signal takes an "FF" (namely, a maximum value of the contents of the U/D counters 17a and 17b). The circuit characteristic of the above-mentioned circuit configuration is previously set so that the digital output signal takes the "FF" at the same time as the current for driving the laser diode 1 takes a maximum permissible value. When the digital output signal takes the "FF", all input terminals of the 8-input NAND gate 17c are kept at a high level, and the output signal of the gate 17c takes a low level. Accordingly, the 2-input AND gate 17d is closed, and the U/D counters 17a and 17b take the down-count mode. When the next sampling clock signal is supplied to the U/D counters 17a and 17b, the digital output signal from the U/D counters takes an "FE" (namely, a value next to the previously-mentioned maximum value "FF"). Thus, the output signal of the 8-input NAND gate 17c again takes the high level, to cause the U/D counters 17a and 17b to take the up-count mode. As mentioned above, the current control operation is performed in a range defined by the "FF" and "FE", in order to prevent the current for driving the laser diode 1 from exceeding the maximum permissible value.

On the other hand, when the current for driving the laser diode 1 takes the maximum permissible value, the flip-flop circuit 17h is triggered by the low-level signal from the NAND gate 17c to generate the maintenance signal, which operates the indicator 20. Thus, an operator is informed of the necessity of a maintenance operation.

In laser beam printers, the generation of laser light is modulated by a video signal sent out from the signal generator 18, to form a picture image. When the video signal takes a high level, the transistor 3 is turned on and the transistor 4 is turned off. Accordingly, the laser diode 1 does not emit laser light (or emits a weak laser beam substantially incapable of producing an exposure effect on the photoconductive surface of the drum). When the video signal takes a low level, the transistor 3 is turned off and the transistor 4 is turned on. Thus, the laser diode is operated at a current set by the above-mentioned current control operation, and thus emits laser light having a predetermined intensity.

As can be seen from the foregoing description, the present embodiment has the following advantages.

(a) The comparator and the U/D counter are the main circuit elements of the control circuit for feedback control, and therefore only the comparator and U/D counter 17 are required to have rapid response. Accordingly, the embodiment is low in cost.

(b) A value "0" is loaded in the U/D counter when the power switch is turned on, and then the contents of the U/D counter are increased by one LSB of the input of the D/A converter each time the sampling clock signal is supplied to the U/D counter. Accordingly, a large starting current does not flow through the laser diode, and therefore the degradation thereof is lessened.

(c) The digital output signal from the U/D counter is increased only by one LSB even in the case where a time the analog detection signal is delivered from the photodiode, is not synchronized with a time the sampling clock signal is generated, and therefore the erroneous correction for a current flowing through the laser diode can be made small. Accordingly, a great change is not caused in the exposure of the photoconductive surface.

(d) A maximum value of a current for driving the laser diode is determined by a maximum value "FF" of the contents of the U/D counter, and therefore an excessive current exceeding a permissible value never flows through the laser diode. Accordingly, there is no danger of the laser diode being damaged due to the excessive current.

(e) When the contents of the U/D counter become the maximum value "FF", the counter takes the down-count mode, and thus the contents of the counter are returned to the "FE" (that is, are not returned to "0"). Accordingly, the feedback control is stable.

(f) The maintenance signal is generated when the laser light emitted from the laser diode has a maximum intensity, and therefore a maintenance operation can be appropriately performed.

In the case where the following arrangement is adopted to apply the present embodiment to laser beam printers, the embodiment has additional advantages as mentioned below.

(g) The photodiode for detecting the intensity of laser beam is disposed at a position which is located on the extension of a scanning line for forming an exposed region on the photoconductive surface of the drum. Then, a reduction in light intensity due to a stain in an optical system including a mirror and a lens, can be appropriately corrected, and the maintenance signal is generated when a cleaning operation is required for the optical system.

(h) In the arrangement mentioned in the item (g), an analog signal line can be shortened by disposing the comparator in close vicinity to the photodiode. Thus, the analog detection signal passing through the analog signal line can be made stable to noise.

(i) In the arrangement mentioned in the item (g), the photodiode for detecting the intensity of laser light is disposed on the extension of the scanning line, on the side of the starting point of the scanning line, and is also used as a photodiode for detecting a deflecting position of laser light. In this case, a laser beam printer is made low in cost and simple in structure.

As has been explained in the foregoing, according to the present invention, there is provided a laser light source device in which the intensity of laser light on a predetermined laser light path is kept constant.

We claim:

1. A laser light source device provided with a control circuit for controlling a current supplied to a laser diode, said control circuit comprising:
   a photoelectric transducer for converting the intensity of laser light emitted from said laser diode into an analog detection signal;
   a comparator for comparing said analog detection signal with a reference electrical signal to deliver a binary signal;
   a digital up/down counter applied with said binary signal to change over from one of an up-count mode and a down-count mode to the other;
   a digital-to-analog converter for converting a digital output signal from said digital up/down counter into an analog output signal;
   a current control circuit for controlling a current flowing through said laser diode, in accordance with said analog output signal; and
   means for changing said up-count mode of said digital up/down counter over to said down-count mode when said digital output signal from said digital up/down counter takes a maximum value.

2. A laser light source device according to claim 1, wherein said control circuit includes means for generating a maintenance signal when said digtial output signal from said digital up/down counter takes a maximum value.

3. A laser apparatus provided with a control circuit for controlling a current supplied to a laser diode, said control circuit comprising:
   a photoelectric transducer for converting the intensity of laser light emitted from said laser diode into an analog detection signal;
   a comparator for comparing said analog detection signal with a reference electrical signal to deliver a binary signal;
   a digital up/down counter applied with said binary signal to change over from one of an up/count mode and a down/count mode to the other;
   a digital-to-analog converter for converting a digital output signal from said digital up/down counter into an analog output signal;
   a current control circuit for controlling a current flowing through said laser diode, in accordance with said analog output signal;
   initializing means for loading said digital up/down counter so that said current flowing through said laser diode has a minimum value when power applied to the apparatus is turned on; and
   signal generating means for delivering one sampling clock signal to said digital up/down counter for each binary signal delivered from said comparator to said digital up/down counter.

4. A laser apparatus according to claim 3, wherein said control circuit includes means for changing said up/count mode of said digital up/down counter over to said down/count mode when said digital output signal from said digital up/down counter takes a maximum value.

5. A laser apparatus according to claim 3, wherein said control circuit includes means for generating a maintenance signal when said digital output signal from said digital up/down counter takes a maximum value.

6. A laser apparatus provided with a control circuit for controlling a current supplied to a laser diode, said laser apparatus adapted for scanning laser light to form an exposed region on a photoconductive surface, comprising:
   a photoelectric transducer for converting the intensity of laser light emitted from said laser diode into an analog detection signal, said photoelectric transducer being disposed on an extension line of a laser scanning line;
   a comparator for comparing said analog detection signal with a reference electrical signal to deliver a binary signal;
   a digital up/down counter applied with said binary signal to change over from one of an up-count mode and a down-count mode to the other;
   a digital-to-analog converter for converting a digital output signal from said digital up/down counter into an analog output signal;
   a current control circuit for controlling a current flowing through said laser diode, in accordance with said analog output signal; and
   wherein said control circuit includes means for changing said up-count mode of said digital up/down counter over to said down-count mode when said digital output signal from said digital up/down counter takes a maximum value.

7. A laser apparatus according to claim 6, wherein said control circuit includes means for generating a maintenance signal when said digital output signal from said digital up/down counter takes a maximum value.

8. A laser apparatus provided with a control circuit for controlling a current supplied to a laser diode, said laser apparatus adapted for scanning laser light to form an exposed region on a photoconductive surface, comprising:
   a photoelectric transducer for converting the intensity of laser light emitted from said laser diode into an analog detection signal, said photoelectric transducer being disposed on an extension line of a laser scanning line;
   a comparator for comparing said analog detection signal with a reference electrical signal to deliver a binary signal;
   a digital up/down counter applied with said binary signal to change over from one of an up-count mode and a down-count mode to the other;
   a digital-to-analog converter for converting a digital output signal from said digital up/down counter into an analog output signal;
   a current control circuit for controlling a current flowing through said laser diode, in accordance with said analog output signal; and
   wherein said control circuit includes initializing means for loading said digital up/down counter so that said current flowing through said laser diode has a minimum value when power applied to said apparatus is turned on, and signal generating means for delivering one sampling clock signal to said digital up/down counter for each binary signal delivered by said comparator to said digital up/down counter.

* * * * *